US012414424B2

(12) United States Patent
Kim et al.

(10) Patent No.: US 12,414,424 B2
(45) Date of Patent: Sep. 9, 2025

(54) MONOLITHICALLY INTEGRATED TOP-GATE THIN-FILM TRANSISTOR AND LIGHT-EMITTING DIODE AND METHOD OF MAKING

(71) Applicant: eMagin Corporation, Hopewell Junction, NY (US)

(72) Inventors: Seonki Kim, Fishkill, NY (US); Amalkumar P. Ghosh, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 605 days.

(21) Appl. No.: 17/850,301

(22) Filed: Jun. 27, 2022

(65) Prior Publication Data

US 2022/0415966 A1 Dec. 29, 2022

Related U.S. Application Data

(60) Provisional application No. 63/215,776, filed on Jun. 28, 2021.

(51) Int. Cl.
H10H 29/14 (2025.01)
(52) U.S. Cl.
CPC .............................. H10H 29/142 (2025.01)
(58) Field of Classification Search
CPC ................................................ H10H 29/142
See application file for complete search history.

(56) References Cited

U.S. PATENT DOCUMENTS 11,139,339 B2 * 10/2021 Long ................... H10D 30/6745
11,296,170 B2 * 4/2022 Choi .................... H10K 59/122
(Continued)

FOREIGN PATENT DOCUMENTS

JP 2018-060184 4/2018
JP 2018-077361 5/2018
(Continued)

OTHER PUBLICATIONS

Matthew Hartensveld, "Fully Monolithic GaN μLED Display System", SID Society for Information Display, Jun. 28, 2021, pp. 880-883, vol. 52, Issue 1, https://doi.org/10.1002/sdtp. 14825.
(Continued)

Primary Examiner — Mark W Tornow
(74) Attorney, Agent, or Firm — Kaplan Breyer Schwarz, LLP

(57) ABSTRACT

Pixels and sub-pixels suitable for high-density displays are disclosed. High-density is realized by forming a top-gate thin-film transistor (TFT) directly on top of a light-emitting diode (LED), thereby reducing the real estate required. To enable the stacked structure, a planarization layer is formed such that its top surface is coplanar with the top surface of the top electrode of the LED. The source and drain of the TFT are then formed on the planarization layer and electrode such that electrical contact is made between the LED and the TFT. In some embodiments, the fabrication includes deposition of an additional planarization layer whose top surface is coplanar with the top surface of the gate of the TFT. This enables formation of a parallel-plate capacitor on the TFT/LED stack, thereby reducing the footprint of the pixel even further.

12 Claims, 8 Drawing Sheets

(56) References Cited

U.S. PATENT DOCUMENTS

| | | | |
|---|---|---|---|
| 2015/0214249 A1 | 7/2015 | Cheng et al. | |
| 2016/0126293 A1* | 5/2016 | Li | H10H 20/812 |
| | | | 257/29 |
| 2016/0293586 A1* | 10/2016 | Ghosh | H01L 25/167 |
| 2019/0355799 A1 | 11/2019 | Jeong et al. | |
| 2021/0343905 A1* | 11/2021 | Kishimoto | H10H 20/8312 |

FOREIGN PATENT DOCUMENTS

| | | |
|---|---|---|
| KR | 10-2018-0015144 | 2/2018 |
| KR | 2018-0052977 | 5/2018 |
| KR | 10-2019-0037568 | 4/2019 |
| WO | 2016/179092 | 11/2016 |
| WO | 2019/220246 | 7/2021 |
| WO | 2020/100290 | 9/2021 |

OTHER PUBLICATIONS

Authorized Officer Kari Rodriguez, International Search Report and Written Opinion mailed on Oct. 27, 2022 issued in PCT Patent Application No. PCT/US2022/035149.
Office Action and English Translation thereof issued on Feb. 5, 2025 in related Korean Patent Application No. 10-2024-7002808.
Office Action and English Translation thereof issued on Jan. 7, 2025 in related Japanese Patent Application No. 2023-579809.

* cited by examiner

MONOLITHICALLY INTEGRATED TOP-GATE THIN-FILM TRANSISTOR AND LIGHT-EMITTING DIODE AND METHOD OF MAKING

CROSS REFERENCE TO RELATED APPLICATIONS

This case claims priority of U.S. Provisional Patent Application 63/215,776 entitled "Monolithically Integrated Top-Gate Thin-Film Transistor and LED," filed Jun. 28, 2021, which is incorporated herein by reference in its entirety. If there are any contradictions or inconsistencies in language between this application and one or more of the cases that have been incorporated by reference that might affect the interpretation of the claims in this case, the claims in this case should be interpreted to be consistent with the language in this case.

TECHNICAL FIELD

The present disclosure relates to image display technology and, more particularly, to LED-based microdisplays.

BACKGROUND

Inorganic light-emitting diodes (LED) are robust, have long lifetimes, and can emit brighter light than other types of LED, such as organic light-emitting diodes (OLED). As a result, they are attractive for use as pixel elements in emissive displays and microdisplays.

Historically, however, it has been difficult to integrate inorganic LED with the pixel drive circuitry in the backplane of a display. Inorganic LEDs are generally made with compound semiconductor material including group III-V or II-VI materials, for example, Gallium Nitride (GaN). Compound semiconductor materials require very high temperature for processing (>700 C). The drivers made using compound semiconductor technology exhibit significantly higher voltages compared to the standard silicon technology such as complimentary metal-oxide semiconductor (CMOS) with single crystal silicon or thin-film transistors (TFT) using amorphous silicon (aSi) or polycrystalline silicon (poly-Si). As a result, the fabrication of a practical display device using just GaN has been challenging.

While there have been attempts to monolithically combine inorganic LEDs with standard silicon-based transistor technology to realize displays, they have been largely unsuccessful. For example, Hartensveld disclosed the heteroepitaxial integration of GaN-based microLEDs on a silicon substrate in "Fully Monolithic GaN µLED Display System," *Proceedings of Display Week* 2021 published by the Society for Information Display, paper 61-5, held online May 17-21, 2021, which is incorporated herein by reference. Unfortunately, the cost and complexity of such monolithic integration technology is prohibitive for its use in many applications.

Heterogeneous integration of inorganic LEDs and silicon-based electronics offers an alternative approach to monolithic integration. Such approaches employ pick-and-place technology to transfer arrays of fully formed LEDs from a bulk LED substrate to receiving substrates containing previously formed silicon transistor circuitry, where solder-bump bonding, or thermoset resin containing conductive particles, is used to operatively couple the LEDs and the circuitry. Unfortunately, long-term reliability and production-yield issues continue to be difficult to overcome.

More recently, inorganic LED monolithically integrated with TFT circuitry has been demonstrated. For example, successful integration of bottom-gate TFT circuitry with inorganic LEDs was disclosed by Gosh in U.S. Pat. No. 9,793,252, issued Oct. 17, 2017, which is incorporated herein by reference. Unfortunately, the complicated layer stack structure of such structures gives rise to challenging fabrication issues that continue to impede adoption of this technology in many applications.

Inorganic LEDs and TFT transistor-based circuitry that are monolithically integrated in a practical and cost-effective manner would represent a significant advance over the prior art.

SUMMARY

The present disclosure is directed to monolithic integration of top-gate TFT circuitry and inorganic LEDs. Embodiments in accordance with the present disclosure are particularly well-suited for use in displays, microdisplays, augmented-reality systems, and virtual-reality systems.

An advance over the prior art is realized by forming a display whose pixels include a TFT having a top-gate architecture that is disposed directly on an LED, where the layer structure of the devices is combined. As a result, the combined layer structure of the circuitry and LEDs is significantly simplified and easier to fabricate, thereby reducing manufacturing costs and offering improved yield.

An illustrative embodiment comprises a top-gate TFT that is formed directly on the top of an inorganic LED structure. The TFT and LED are monolithically integrated on a sapphire substrate. In order to enable formation of the TFT on top of the LED, the topography of the LED is accommodated by the inclusion of a planarization layer that includes dielectric material. The planarization layer is formed over the LED structure and polished back such that its top surface is coplanar with the top surface of the anode of the LED, which is simultaneously exposed. Once the planarization layer is formed and the top surface of the anode is exposed, the source and drain of the TFT are formed such that the drain resides on the anode and they are in electrical communication. The transistor structure is then completed by deposition of conformal layers of semiconductor and dielectric material that define the channel region and gate dielectric of the TFT. A gate electrode is then formed on the top of the gate dielectric to complete the monolithically integrated structure of the TFT and LED.

Since the TFT is formed such that its drain is disposed on and in physical contact with the anode of the underlying LED, pixels and sub-pixels in accordance with the present disclosure can be scaled down to sizes that, heretofore, were impossible using prior-art approaches. By scaling the pixels and sub-pixels to extremely small dimensions, they can be used large-format displays, standard-resolution displays, or near-eye displays.

In some embodiments, the anode of the LED and one of the drain or source of the TFT are formed of the same layer. In some embodiments, the anode of the LED functions as the drain or source of the TFT.

In some embodiments, a storage capacitor is also monolithically integrated with the TFT and LED structures by forming it directly above the gate of the TFT. In some embodiments, the gate of the TFT functions as one plate of the storage capacitor.

An embodiment in accordance with the present disclosure is a display comprising a first pixel that includes: a first light-emitting diode (LED) that includes a first cathode and a first anode; and a first thin-film transistor (TFT) disposed on the first LED, wherein the first TFT includes a first source, a first drain, and a first gate that is distal to a substrate; wherein the first LED and the first TFT are monolithically integrated on the substrate such that one of the first cathode and first anode is electrically coupled with one of the first source and the first drain.

Another embodiment in accordance with the present disclosure is a display comprising a plurality of pixels, wherein each pixel of the plurality of pixels includes: a light-emitting diode (LED) that includes a cathode and an anode, the LED being disposed on a substrate, and one of the cathode and anode having a first surface that is distal to the substrate; a planarization layer having a second surface that is coplanar with the first surface, the planarization layer comprising a dielectric material; and a thin-film transistor (TFT) disposed on the LED and the planarization layer, wherein the TFT includes a source, a drain, and a gate that is distal to the substrate, and wherein one of the source and drain is electrically coupled with one of the anode and the cathode, and further wherein the other one of the source and drain is disposed on the planarization layer; wherein the plurality of LEDs and the plurality of TFTs are monolithically integrated on the substrate.

Yet another embodiment in accordance with the present disclosure is a method for forming a display that includes a plurality of pixels, the method including: forming a plurality of light-emitting diodes (LEDs) on a substrate, wherein each LED of the plurality thereof includes a cathode and an anode, one of the cathode and anode having a first surface that is distal to the substrate; forming a planarization layer comprising a dielectric material, the planarization layer having a second surface that is coplanar with the plurality of first surfaces; and forming a plurality of thin-film transistors (TFTs) such that each TFT of the plurality thereof is disposed on a different LED of the plurality of LEDs, wherein each TFT of the plurality thereof includes a source, a drain, and a gate that is distal to the substrate; wherein each TFT is formed such that (1) one of the first source and first drain is disposed on and electrically connected with one of the first anode and first cathode of its respective LED and (2) the other one of the source and drain is disposed on the second surface.

DETAILED DESCRIPTION

Figure 1A:
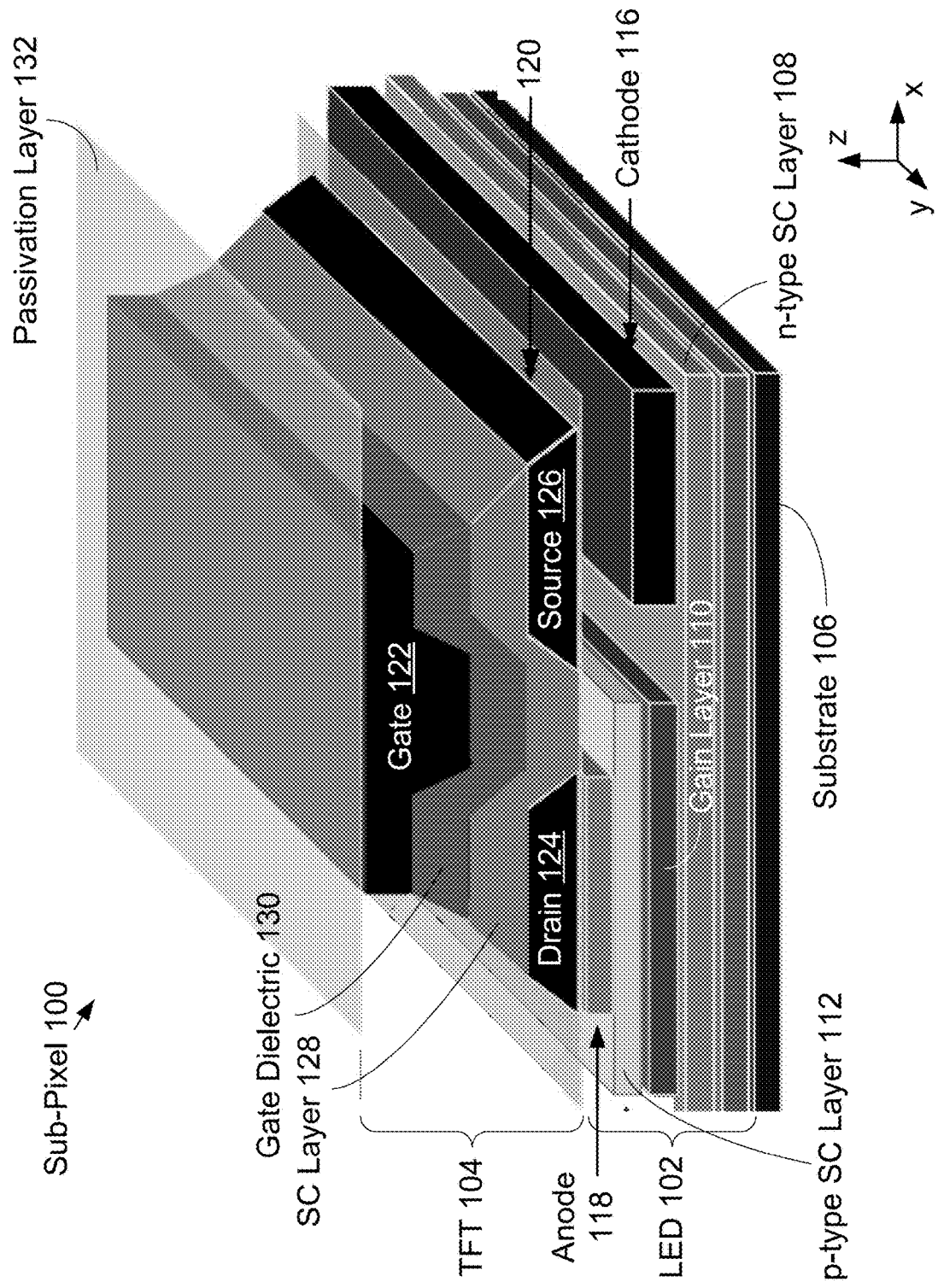
FIGS. 1A-B depict schematic drawings of perspective and cross-sectional views of a portion of a pixel suitable for use in an emissive display in accordance with the present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The functions of the various elements shown in the Drawing, including any functional blocks that may be labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

Unless otherwise explicitly specified herein, the figures comprising the drawing are not drawn to scale.

As noted above, monolithic integration of top-gate TFT circuitry and inorganic LEDs for use in display and micro-display applications affords embodiments in accordance with the present disclosure with significant advantages over the prior art. First, the combined layer structure of the circuitry and LEDs is significantly simplified. Second, such a design is significantly easier to fabricate, reducing manufacturing costs and offering improved system yield. Third, the layer stacks of the TFT and LED are substantially independent from one another. As a result, neither needs to be compromised due to the inclusion of the other.

Figure 1B:
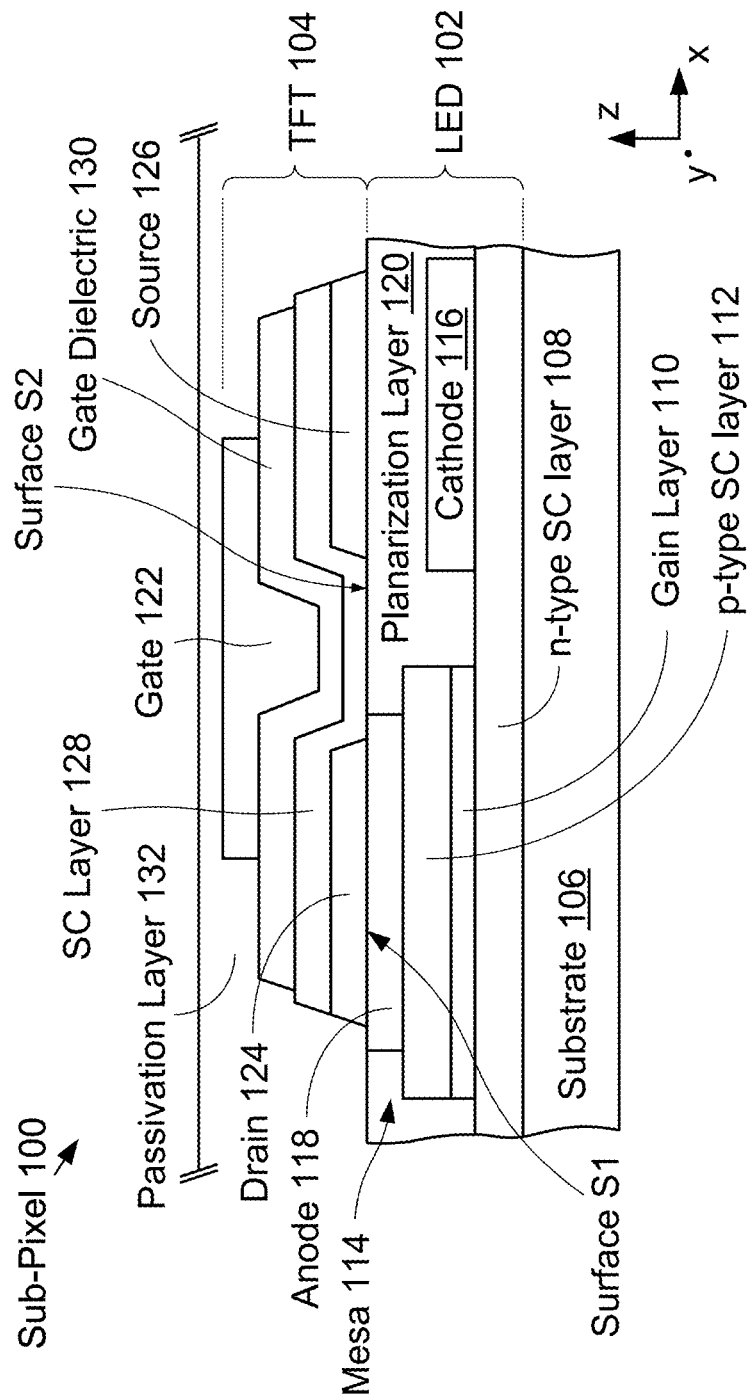

FIGS. 1A-B depict schematic drawings of perspective and cross-sectional views of a portion of a pixel suitable for use in an emissive display in accordance with the present disclosure. Sub-pixel 100 includes LED 102 and TFT 104, which are monolithically integrated on substrate 106.

For the purposes of this Specification, including the appended claims, the term "monolithically integrated" is defined as formed either: in the body of a substrate, typically by etching into the substrate or; on the surface of the substrate, typically by patterning layers disposed on the surface. The term monolithically integrated explicitly excludes systems/devices that have been integrated using hybrid integration methods, such as the joining of fully formed devices using processes such as gluing, solder-bump bonding, and the like.

Figure 2:
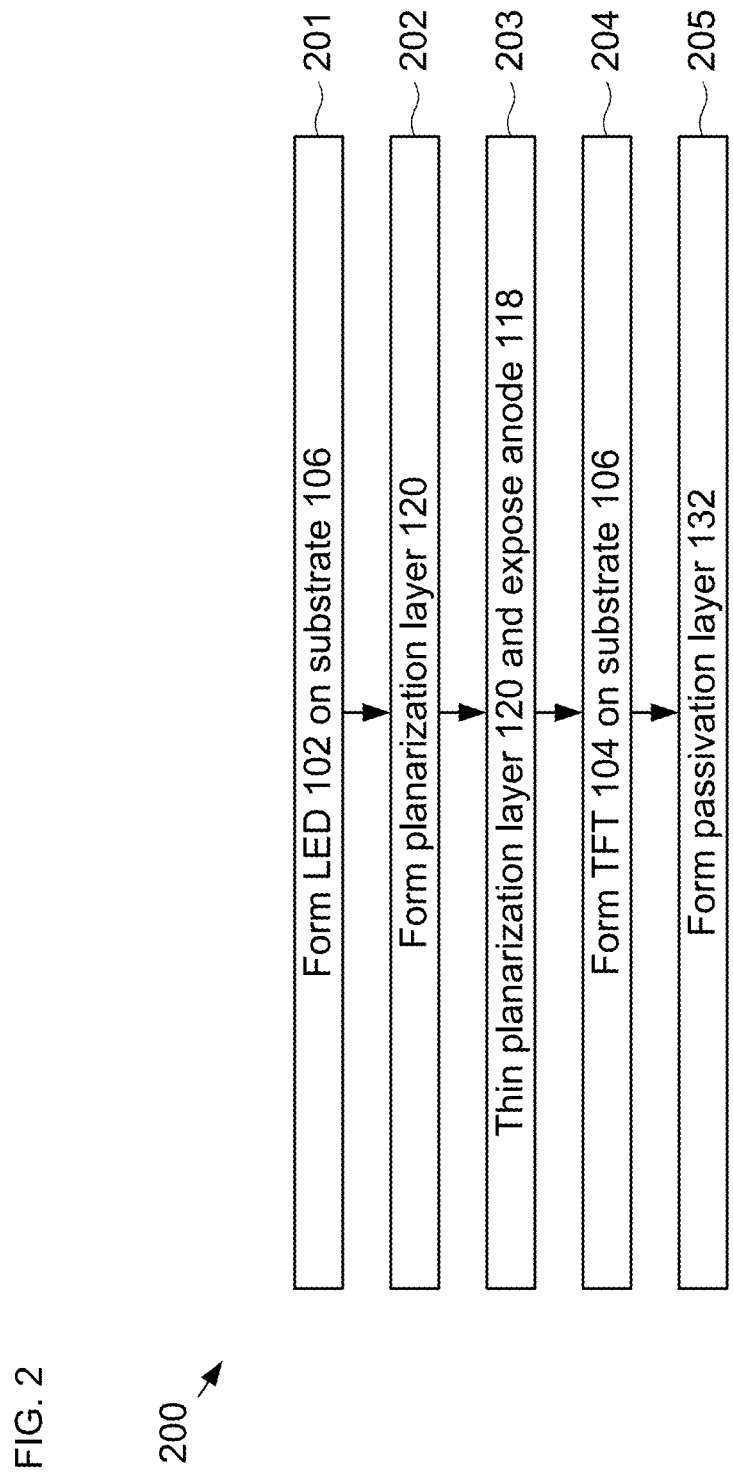
FIG. 2 depicts operations of a method suitable for forming a sub-pixel of a pixel of a display in accordance with the present disclosure.

FIG. 2 depicts operations of a method suitable for forming a sub-pixel of a pixel of a display in accordance with the present disclosure. Method 200 begins with operation 201, wherein LED 102 is formed on substrate 106.

Substrate 106 is a substrate suitable for use in a planar-processing fabrication method. Preferably, substrate 106 is substantially transparent for the light emitted by LED 102. In the depicted example, substrate 106 is a sapphire substrate; however, other substrates suitable for use in accordance with the present disclosure will be apparent to one skilled in the art, after reading this Specification.

LED 102 is an inorganic LED structure that is epitaxially grown on substrate 106. LED 102 comprises, among other layers, semiconductor (SC) layer 108, gain layer 110, SC layer 112, cathode 116, and anode 118. Typically, the semiconductor and gain layers of LED 102 are epitaxially grown using metal-organic chemical vapor deposition (MOCVD); however, any suitable growth method can be used to form the layers of LED 102, including atomic layer epitaxy (ALE), molecular beam epitaxy (MBE), and the like.

The formation of LED 102 begins with the epitaxial growth of n-type semiconductor (SC) layer 108 on substrate 106. SC layer 108 functions as an electrically conductive layer that enables electrical connection to cathode 116. It also functions as a lower optical confinement layer for gain layer 110. In the depicted example, SC layer 108 is a layer of n-doped gallium nitride (GaN) having a thickness of approximately 2 microns; however, in some embodiments, SC layer 108 includes a different compound-semiconductor material and/or thickness.

Gain layer 110 is then grown on SC layer 108. Gain layer 110 comprises one or more layers of compound semiconductor material suitable for providing optical gain within the structure of LED 102. In the depicted example, gain layer 110 is a multiple quantum well (MQW) layer comprising alternating layers of indium gallium nitride (InGaN) and gallium nitride (GaN) having a collective thickness of approximately 150 nm; however, in some embodiments, gain layer 110 includes at least one different compound-semiconductor material and/or has a different thickness.

The formation of LED 102 then continues with the epitaxial growth of SC layer 112 on gain layer 110. SC layer 112 functions as a top contact for LED 102 and as an upper optical confinement layer for the gain layer. In the depicted example, SC layer 112 is a layer of p-doped GaN having a thickness of approximately 250 nm; however, in some embodiments, SC layer 112 includes a different compound semiconductor and/or has a different thickness.

Gain layer 110 and SC layer 112 are then patterned to define mesa 114, which exposes a region of SC layer 108 in preparation for the formation of cathode 116.

Cathode 116 is formed on SC layer 108 such that the cathode is electrically coupled with gain layer 110 through SC layer 108. In the depicted example, cathode 116 is a layer of molybdenum (Mo) having a thickness of approximately 50 nm. Typically, cathode 116 is formed via direct patterning by sputtering through a shadow mask; however, any suitable deposition and/or deposition and patterning methods can be used to form cathode 116.

In similar fashion, anode 118 is then formed on SC layer 112 such that the anode is electrically coupled with gain layer 110 through SC layer 112. In the depicted example, anode 118 is a layer of molybdenum (Mo) having a thickness of approximately 20 nm.

Figure 3A:
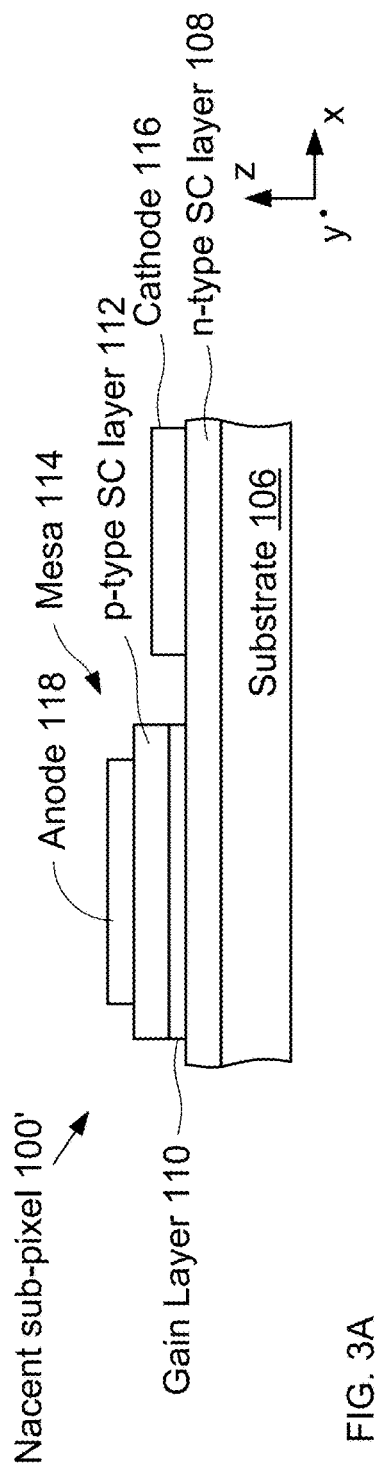
FIG. 3A depicts a schematic drawing of a cross-sectional view of nascent sub-pixel 100' after the completion of LED 102.

FIG. 3A depicts a schematic drawing of a cross-sectional view of nascent sub-pixel 100' after the completion of LED 102.

Once LED 102 is complete, method 200 continues with operation 202, wherein planarization layer 120 is formed over the LED structure. Planarization layer 120 is a layer of dielectric material that fills the regions surrounding mesa 114. In the depicted example, planarization layer 120 comprises silicon dioxide that is vapor deposited over the topography of LED 102. In some embodiments, planarization layer 120 is deposited in a manner other than vapor deposition, such as spin coating, spray coating, and the like.

At operation 203, planarization layer 120 is thinned to expose the top surface (i.e., surface S1) of anode 118. As a result, surface S2 (i.e., the top surface of planarization layer 120) is substantially coplanar with surface S1 and defines a flat surface suitable for the formation of the layers of TFT 104 using planar processing technologies. In the depicted example, planarization layer 120 is thinned and planarized via chemical-mechanical polishing (CMP); however, any suitable method can be used without departing from the scope of the present disclosure.

Figure 3B:
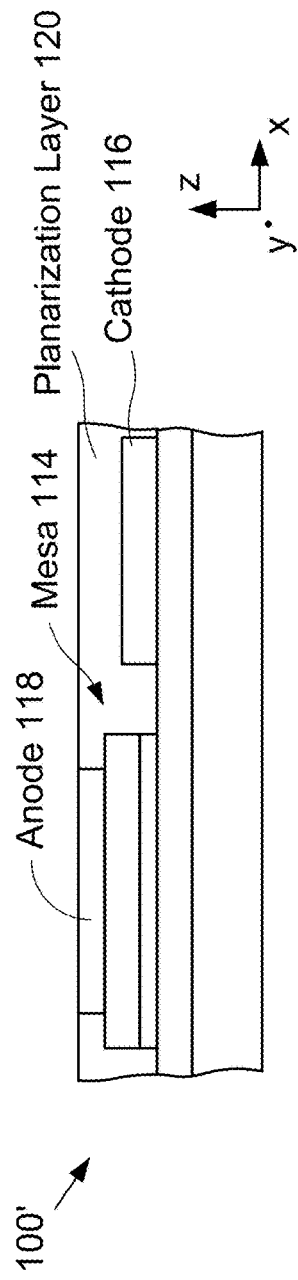
FIG. 3B depicts a schematic drawing of a cross-sectional view of nascent sub-pixel 100' after the completion of planarization layer 120.

FIG. 3B depicts a schematic drawing of a cross-sectional view of nascent sub-pixel 100' after the completion of planarization layer 120.

At operation 204, TFT 104 is formed on substrate 106.

TFT 104 is a FET transistor structure that is configured such that its gate is distal to LED 102. TFT 104 includes gate 122, drain 124, source 126, semiconductor layer 128, and gate dielectric 130.

The formation of TFT 104 begins with formation of drain 124 on anode 118 and source 126 on the top surface of planarization layer 120. Typically, drain 124 and source 126 are formed in the same operation using methods analogous to those described above and respect to the formation of cathode 116. In the depicted example, each of drain 124 and source 126 is a layer of molybdenum having a thickness of approximately 20 nm.

After the definition of drain 124 and source 126, SC layer 128 is deposited over them using a conformal deposition method such that its material resides between the source and drain. In the depicted example, SC layer 128 is a layer of indium gallium zinc oxide (IGZO) having a thickness of approximately 40 nm.

Gate dielectric 130 is then formed on SC layer 128. In the depicted example, gate dielectric 130 is a layer of silicon dioxide having a thickness of approximately 150 nm.

The formation of TFT 104 is completed with the definition of gate 122 on the top surface of gate dielectric 130. In the depicted example, gate 122 includes a layer of molybdenum having a thickness of approximately 20 nm.

As will be apparent to one skilled in the art after reading this Specification, however, any suitable thickness and/or material can be used for any of the constituent layers/structures of TFT 104 without departing from the scope of the present disclosure.

As will also be apparent to one skilled in the art, in some embodiments, sub-pixel 100 typically includes additional semiconductor layers (e.g., buffer layers, contact-enhancement layers, etc.), as well as additional features, such as vias, bond pads, and electrical traces that enable its electrical connection to other sub-pixels, control circuitry, drive circuitry and the like. For clarity, these layers/features are not shown in the depicted example.

Figure 3C:
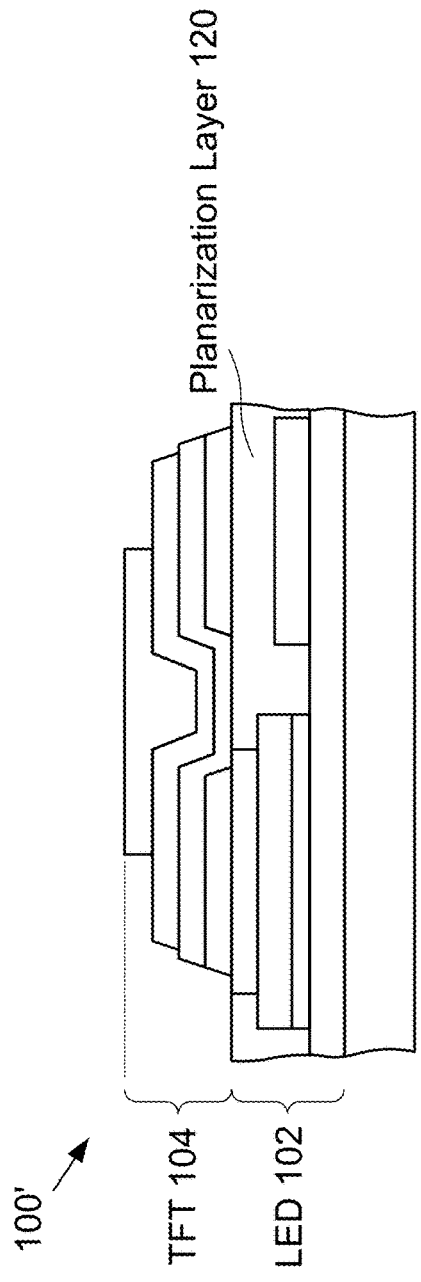
FIG. 3C depicts a schematic drawing of a cross-sectional view of nascent sub-pixel 100' after the completion of TFT 104.

FIG. 3C depicts a schematic drawing of a cross-sectional view of nascent sub-pixel 100' after the completion of TFT 104.

At operation 205, passivation layer 132 is formed to electrically passivate LED 102 and TFT 104, thereby completing sub-pixel 100.

Upon completion of sub-pixel 100, TFT 104 and LED 102 are electrically coupled via drain 124 and anode 118, which are formed such that the drain is in physical contact with the anode. In some embodiments, anode 118 and drain 124 are defined by a single element within the structure of TFT 104.

Figure 4A:
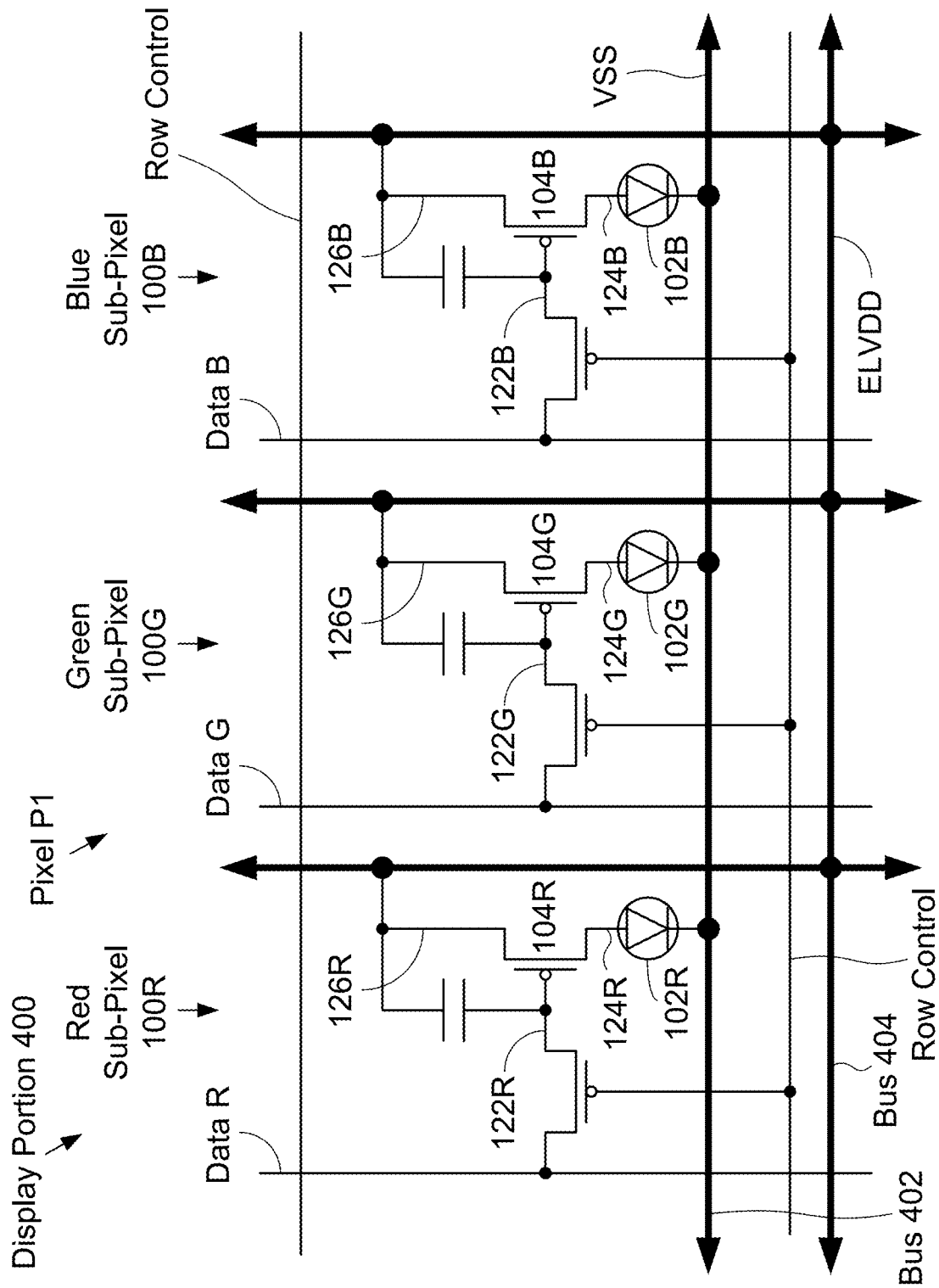
FIG. 4A shows a schematic drawing of the electrical layout of a pixel of a display, the pixel including red, green, and blue sub-pixels, in accordance with the present disclosure.

FIG. 4A shows a schematic drawing of the electrical layout of a pixel of a display, the pixel including red, green, and blue sub-pixels, in accordance with the present disclosure. Display portion 400 depicts pixel P1, which is one pixel of a display comprising a plurality of substantially identical pixels. Pixel P1 includes three sub-pixels 100R, 100G, and 100B, bus 402, and bus 404.

Figure 4B:
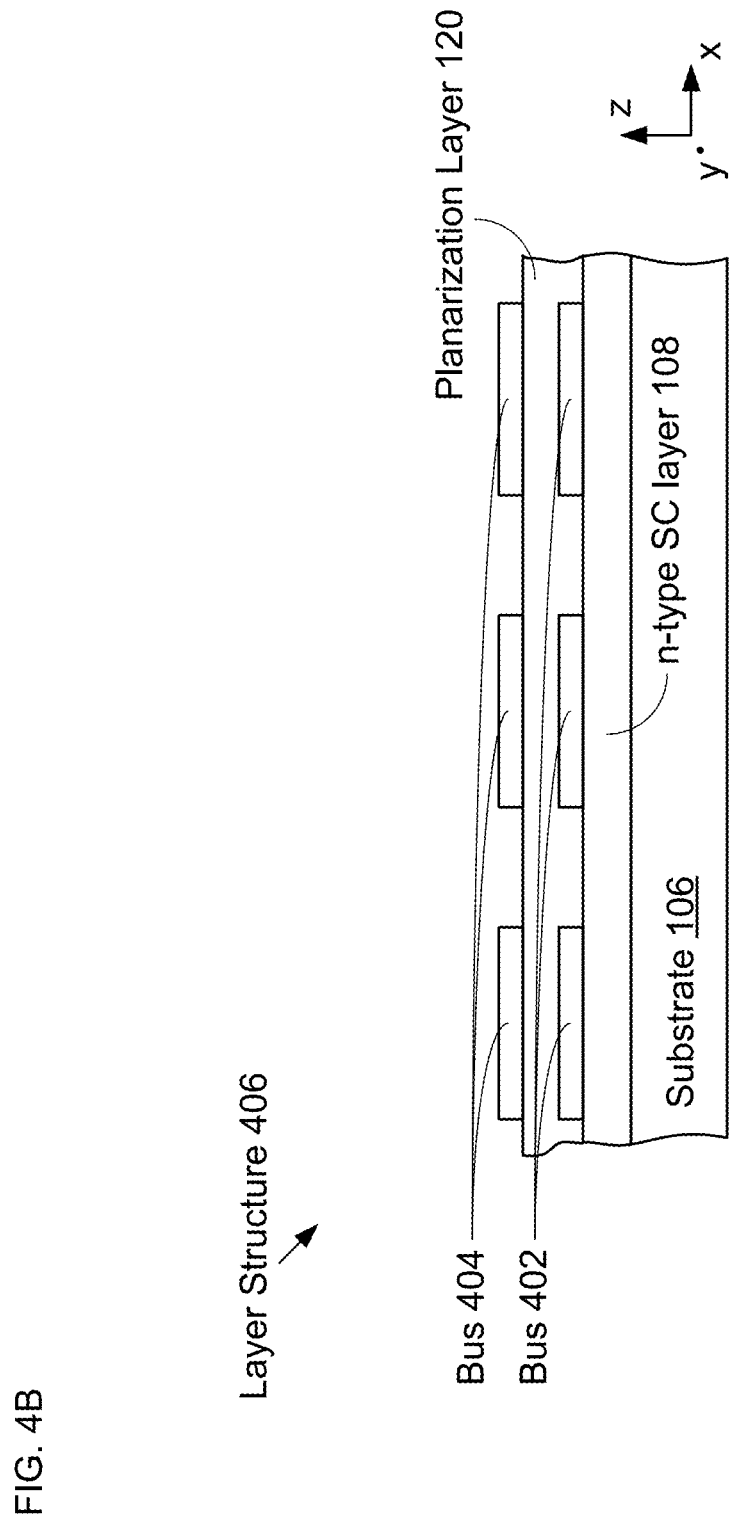
FIG. 4B shows a schematic drawing of cross-sectional view of the layer structure of the electrical-bus regions of sub-pixels 100R, 100G, and 100B.

FIG. 4B shows a schematic drawing of cross-sectional view of the layer structure of the electrical-bus regions of sub-pixels 100R, 100G, and 100B. Layer structure 406 depicts only bus 402 and bus 404, as well as the interlayer dielectric that resides between them to provide electrical isolation.

Each of sub-pixels 100R, 100G and 100B includes, among other circuit elements, an LED 102 that is configured to emit the desired color of that sub-pixel, as well as TFT 104, which are electrically connected as discussed above and with respect to FIGS. 1A-B. In other words, sub-pixels 100R, 100G and 100B include LED 102R, 104G, and 104B, respectively, where LED 102R emits red light, LED 102R emits green light, and LED 102B emits blue light.

In each of sub-pixels 100R, 100G, and 100B, LED cathode 116 is electrically connected to electrical bus 402, which is held at a common VSS voltage level. In similar fashion, in each sub-pixel, the source of its respective drive-transistor 104 is electrically connected to electrical bus 404, which is held at a common ELVDD voltage level.

In the depicted example, bus 402 is formed at the same time as cathode 116; however, bus 402 can be formed in a separate process without departing from the scope of the present disclosure.

In similar fashion, in the depicted example, bus 404 is formed at the same time as drain 124 and source 126; however, bus 404 can be formed in a separate process without departing from the scope of the present disclosure.

Bus 402 is electrically isolated from bus 404 by a portion of planarization layer 120, which functions as an interlayer dielectric. In some embodiments, a different dielectric layer is included to electrically isolate bus 402 and bus 404.

Figure 5:
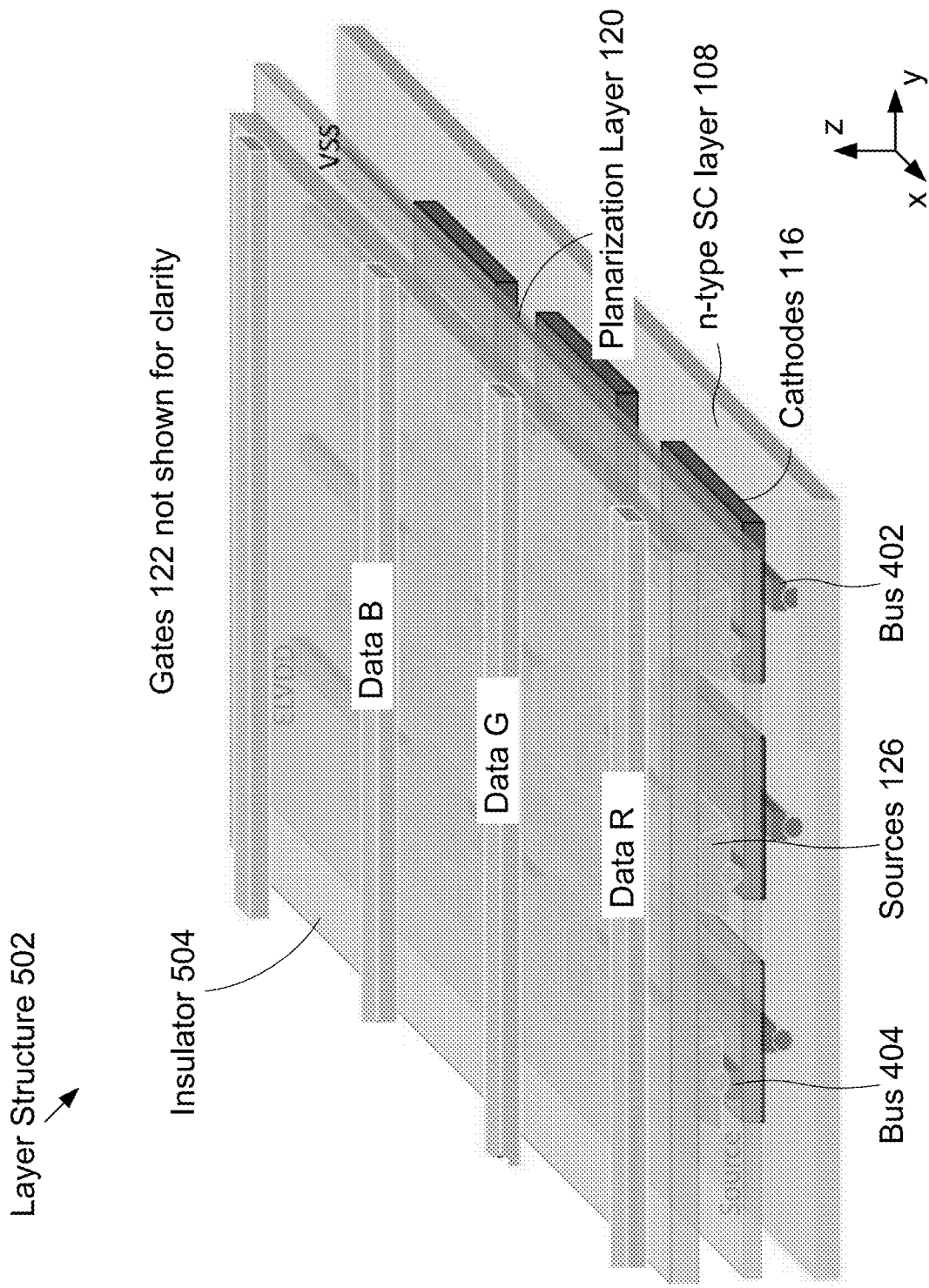
FIG. 5 shows a schematic drawing of a more detailed perspective view of the layer structure of circuit portion 400.

FIG. 5 shows a schematic drawing of a more detailed perspective view of the layer structure of circuit portion 400. As is common to most LED-based displays, data lines Data R, Data G, and Data B are common to all of the pixels in the same row of the display. Typically, the data lines and gates of each sub-pixel are separated by a thick layer of electrical insulator (i.e., insulator 504). In some embodiments, insulator 504 includes passivation layer 132.

In the prior art, each pixel (or sub-pixel) typically includes a storage capacitor that is located adjacent to the transistor and LED. In other words, the circuit elements included in the pixel drive circuitry is horizontally arranged. As a result, each circuit element requires a significant amount of chip real estate, which places a lower limit on how small each pixel can be (and a commensurate upper limit on pixel density).

It is aspect of the present disclosure, however, that a storage capacitor can be formed on top of a TFT to realize a vertical arrangement of elements, thereby reducing the real estate required for a given pixel drive circuit.

Figure 6:
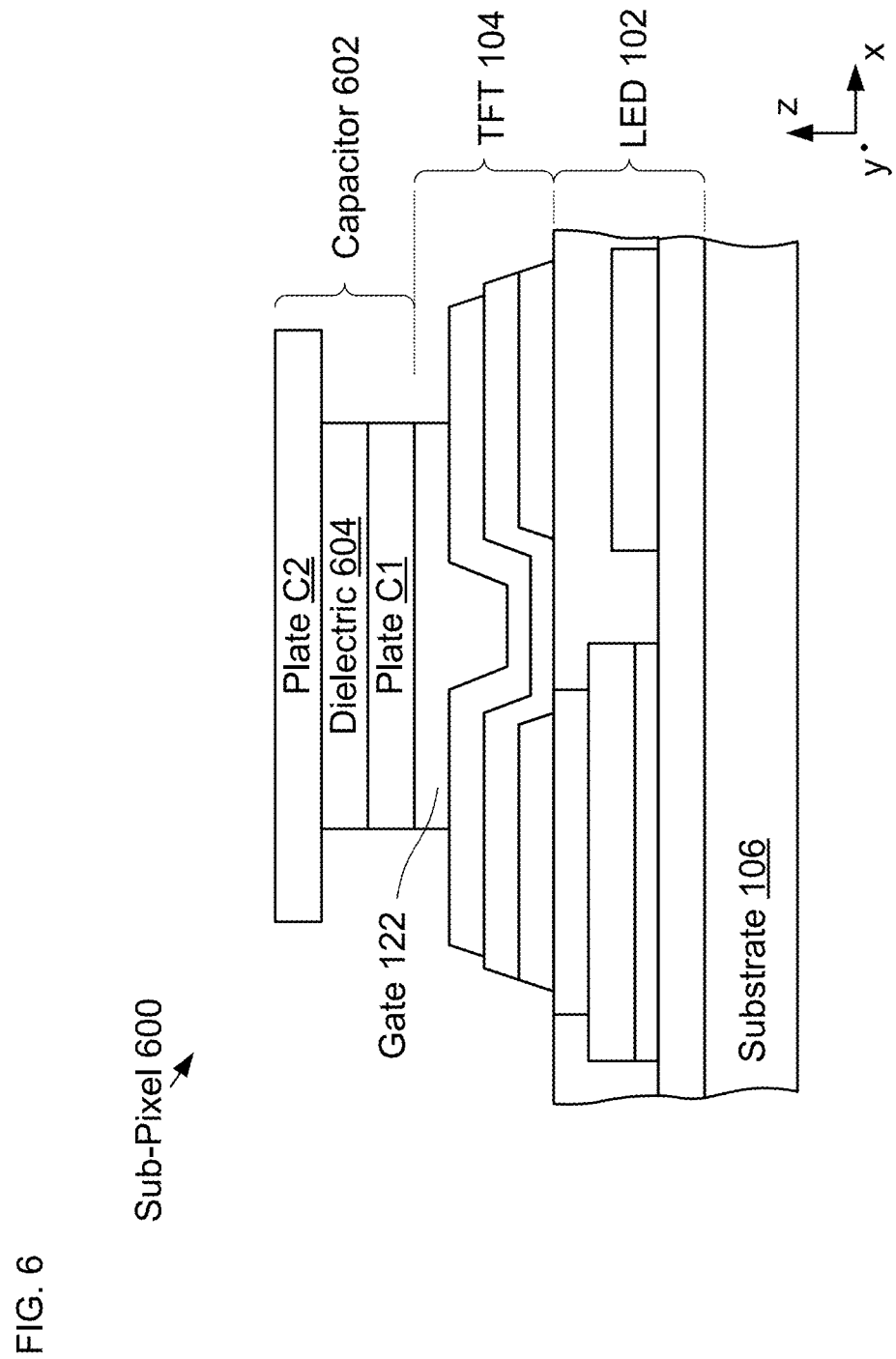
FIG. 6 depicts a schematic drawing of a sub-pixel that includes a monolithically integrated storage capacitor in accordance with the present disclosure.

FIG. 6 depicts a schematic drawing of a sub-pixel that includes a monolithically integrated storage capacitor in accordance with the present disclosure. Sub-pixel 600 comprises sub-pixel 100 and capacitor 602.

Capacitor 602 is a parallel plate capacitor that includes capacitor plates C1 and C2, which are located on either side of dielectric 604. Capacitor 602 is formed on sub-pixel 100 such that plate C1 is in physical and electrical contact with gate 122.

Each of capacitor plates C1 and C2 is analogous to cathode 116 described above. In the depicted example, each capacitor plate is a layer of molybdenum having a thickness of approximately 50 nm.

Dielectric 604 is analogous to gate dielectric 130 described above. In the depicted example, dielectric 604 is a layer of silicon dioxide having a thickness of approximately 150 nm.

Although not depicted, typically, a planarization layer analogous to planarization layer 120 is formed over sub-pixel 100 prior to the formation of plate C1.

By forming sub-pixel 600 such that capacitor 602 is disposed on top of TFT 104, embodiments in accordance with the present disclosure are afforded significant advantages over the prior art, including:

i. reduced pixel area required for circuitry; or
ii. greater pixel density; or
iii. increased circuit complexity without sacrificing pixel density; or
iv. a larger capacitor, enabling better storage performance; or
v. any combination of i, ii, iii, and iv.

It is to be understood that the disclosure teaches some examples of the illustrative embodiment and that many variations of the invention can easily be devised by those skilled in the art after reading this disclosure.

The invention claimed is:
1. A display comprising a first pixel that includes:
a first light-emitting diode (LED) that includes a first cathode and a first anode, wherein one of the first cathode and first anode includes a first surface;

a planarization layer having a second surface, wherein the second surface is substantially coplanar with the first surface; and a first thin-film transistor (TFT) disposed on the first LED, wherein the first TFT includes a first source, a first drain, and a first gate that is distal to a substrate, and wherein one of the first source and first drain is disposed on and in direct physical contact with the first surface, and further wherein the other one of the first source and first drain is in direct physical contact with the second surface;

wherein the first LED and the first TFT are monolithically integrated on the substrate such that the one of the first cathode and first anode is directly electrically connected with the one of the first source and the first drain; and wherein the TFT is disposed on the LED such that the layer structures of the TFT and LED are combined.

2. The display of claim 1 wherein the first source is disposed on and in direct physical and electrical contact with the first surface.

3. The display of claim 1 wherein the first drain is disposed on and in direct physical and electrical contact with the first surface.

4. The display of claim 3 wherein the first anode and the first drain are the same element such that the first anode is configured to function as the first drain.

5. The display of claim 1 wherein the first pixel further comprises a parallel-plate capacitor having a first plate, a second plate, and a dielectric layer disposed between the first and second plates, and wherein the first plate is electrically coupled with the first gate, and wherein the first plate is disposed on and in physical contact with the first gate.

6. The display of claim 5 wherein the first gate and the first plate are the same element such that the first gate is configured to function as the first plate.

7. The display of claim 1, wherein the first pixel further includes:

a second LED that includes a second cathode and a second anode; and a second TFT disposed on the second LED, wherein the second TFT includes a second source, a second drain, and a second gate that is distal to the substrate;

wherein the second LED and the second TFT are monolithically integrated on the substrate such that one of the second cathode and second anode is electrically coupled with one of the second source and the second drain.

8. A display comprising a plurality of pixels, wherein each pixel of the plurality of pixels includes:

a light-emitting diode (LED) that includes a cathode and an anode, the LED being disposed on a substrate, and one of the cathode and anode having a first surface that is distal to the substrate;

a planarization layer having a second surface that is coplanar with the first surface, the planarization layer comprising a dielectric material; and a thin-film transistor (TFT) disposed on the LED and the planarization layer, wherein the TFT includes a source, a drain, and a gate that is distal to the substrate, and wherein one of the source and drain is disposed on and in direct physical and electrical contact with the first surface;

wherein the LED and TFT of each pixel of the plurality of pixels are monolithically integrated on the substrate; and wherein, within each pixel of the plurality of pixels, its respective TFT is disposed on its respective LED such that their layer structures are combined.

9. The display of claim 8 wherein the anode and the drain are in direct physical contact and electrically connected.

10. The display of claim 9 wherein the anode and the drain are the same element such that the anode functions as the drain.

11. The display of claim 8 wherein each pixel further comprises a parallel-plate capacitor having a first plate, a second plate, and a dielectric layer disposed between the first and second plates, and wherein the first plate is electrically coupled with the gate, and wherein the first plate is disposed on and in physical contact with the gate.

12. The display of claim 11 wherein the first gate and the first plate are the same element such that the first gate is configured to function as the first plate.

\* \* \* \* \*